United States Patent
Takano et al.

(10) Patent No.: US 10,763,848 B2
(45) Date of Patent: Sep. 1, 2020

(54) GATE DRIVE CIRCUIT

(71) Applicant: FUJI ELECTRIC CO., LTD., Kanagawa (JP)

(72) Inventors: Sho Takano, Tokyo (JP); Hidetoshi Umida, Tokyo (JP)

(73) Assignee: FUJI ELECTRIC CO., LTD., Kawasaki-shi, Kanagawa (JP)

( * ) Notice: Subject to any disclaimer, the term of this patent is extended or adjusted under 35 U.S.C. 154(b) by 0 days.

(21) Appl. No.: 16/254,891

(22) Filed: Jan. 23, 2019

(65) Prior Publication Data

US 2019/0273489 A1    Sep. 5, 2019

(30) Foreign Application Priority Data

Mar. 5, 2018   (JP) .................................. 2018-039049

(51) Int. Cl.
| | |
|---|---|
| *H03K 3/00* | (2006.01) |
| *H03K 17/12* | (2006.01) |
| *H03K 17/16* | (2006.01) |
| *H03K 17/687* | (2006.01) |

(52) U.S. Cl.
CPC .................................. *H03K 17/162* (2013.01)

(58) Field of Classification Search
CPC .................................................. H03K 17/162
See application file for complete search history.

(56) References Cited

U.S. PATENT DOCUMENTS

| | | | | |
|---|---|---|---|---|
| 5,675,276 A | * | 10/1997 | Goel | H03K 3/2893 327/143 |
| 7,148,738 B2 | * | 12/2006 | Knoop | G05B 19/054 327/437 |

FOREIGN PATENT DOCUMENTS

JP    2014-124055    7/2014

OTHER PUBLICATIONS

Japanese Office Action dated Apr. 17, 2018 issued with respect to the basic Japanese Patent Application No. 2018-039049.

* cited by examiner

*Primary Examiner* — Kenneth B Wells
(74) *Attorney, Agent, or Firm* — IPUSA, PLLC

(57) ABSTRACT

A gate drive circuit includes a signal generation unit configured to generate a first gate drive signal, a signal isolation unit configured to produce, at an output side thereof in response to the first gate drive signal, a second gate drive signal electrically isolated from the signal generation unit, an output stage device configured to receive the second gate drive signal at an input side thereof and to produce a third gate drive signal at an output side thereof in response to the second gate drive signal, a first path connecting the output side of the signal isolation unit and the input side of the output stage device; and a second path connecting the output side of the signal isolation unit and the output side of the output stage device.

6 Claims, 3 Drawing Sheets

GATE DRIVE CIRCUIT

BACKGROUND OF THE INVENTION

1. Field of the Invention

The disclosures herein relate to a gate drive circuit.

2. Description of the Related Art

There is a type of gate drive circuit that is coupled to a junction field-effect transistor and that has a driver, a booster circuit, and a voltage-drop prevention resistor (see Patent Document 1, for example). The driver produces a signal for placing the junction field-effect transistor in an on state or in an off state. The booster circuit is coupled between the driver and the gate terminal of the junction field-effect transistor, and has first and second bipolar transistors for increasing the electric-current capacity of the driver. The voltage-drop prevention resistor is coupled between the emitter terminal and base terminal of each of the first and second bipolar transistors provided in the booster circuit.

In the related-art gate driver circuit, the voltage-drop prevention resistor situated between the emitter terminal and base terminal of each of the first and second bipolar transistors is connected in series with a resistor of the booster circuit coupled to the driver. With this configuration, the voltage applied between the emitter terminal and base terminal of each of the first and second bipolar transistors via the voltage-drop prevention resistor is equal to a voltage obtained by the potential divider comprised of the resistor of the booster circuit and the voltage-drop prevention resistor.

Consequently, the lowering of the voltage between the emitter terminal and base terminal of each of the first and second bipolar transistors is not sufficiently prevented, resulting in the voltage being lower than the output voltage of the driver.

The lowering of the voltage between the emitter terminal and base terminal of each of the first and second bipolar transistors may pose a risk of causing a semiconductor switch driven by the gate drive circuit to malfunction.

Accordingly, there may be a need to provide a gate drive circuit that is less likely to cause a malfunction.

RELATED-ART DOCUMENTS

Patent Document

[Patent Document 1] Japanese Patent Application Publication No. 2014-124055

SUMMARY OF THE INVENTION

According to an embodiment, a gate drive circuit includes a signal generation unit configured to generate a first gate drive signal, a signal isolation unit configured to produce, at an output side thereof in response to the first gate drive signal, a second gate drive signal electrically isolated from the signal generation unit, an output stage device configured to receive the second gate drive signal at an input side thereof and to produce a third gate drive signal at an output side thereof in response to the second gate drive signal, the output stage device including a first semiconductor switch and a second semiconductor switch which are complementary to each other and driven by the second gate drive signal, the third gate drive signal being produced at a connection point between the first semiconductor switch and the second semiconductor switch, a first path connecting the output side of the signal isolation unit and the input side of the output stage device; and a second path connecting the output side of the signal isolation unit and the output side of the output stage device.

According to at least one embodiment, a gate drive circuit that is less likely to cause a malfunction is provided.

DESCRIPTION OF THE PREFERRED EMBODIMENTS

In the following, embodiments to which a gate drive circuit of the present disclosures is applied will be described.

Embodiments

Figure 1:
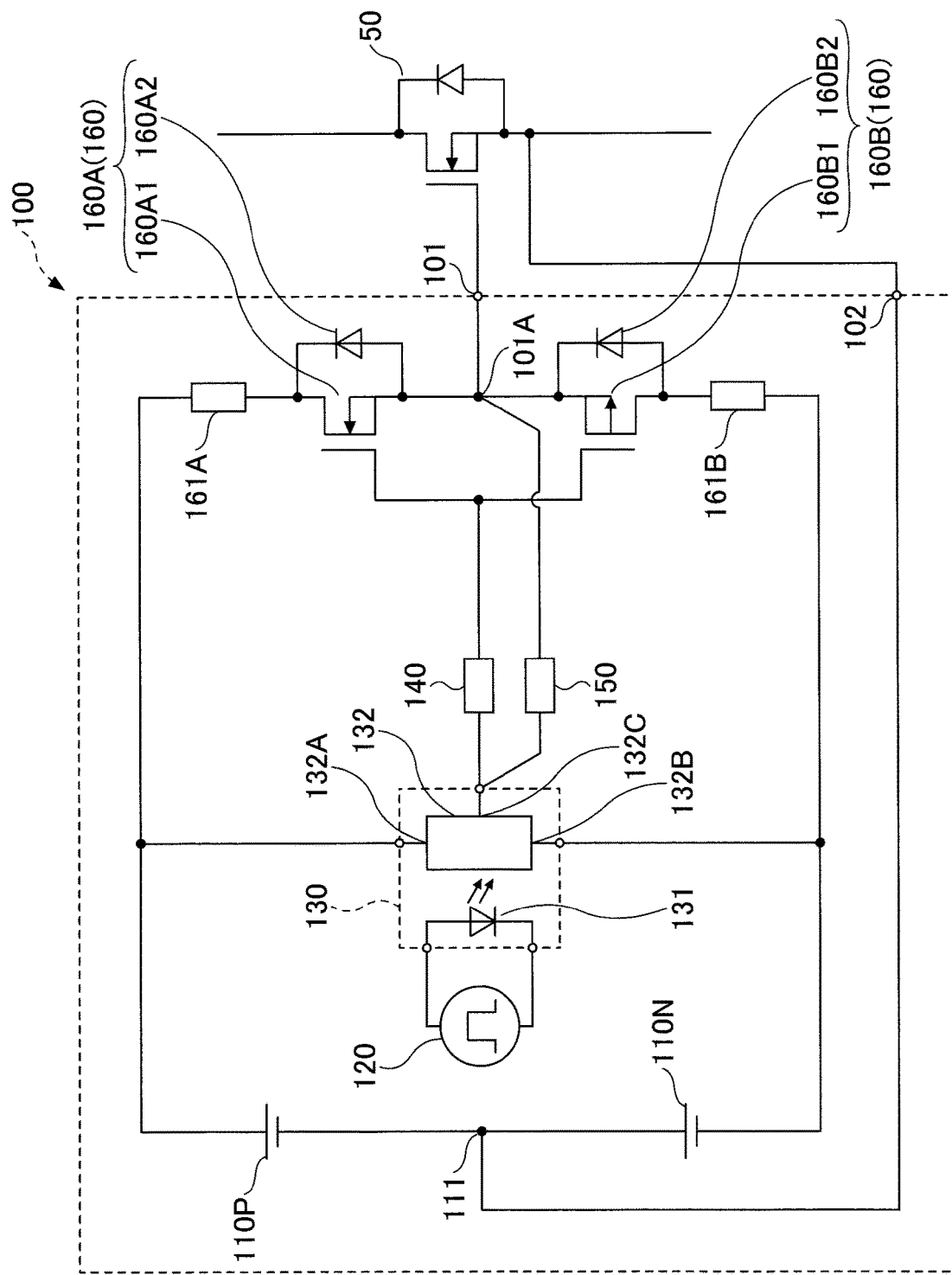
FIG. 1 is a drawing illustrating a gate drive circuit according to an embodiment.

FIG. 1 is a drawing illustrating a gate drive circuit 100 according to an embodiment. The gate drive circuit 100 includes terminals 101 and 102, power supplies 110P and 110N, a signal generation unit 120, a photo coupler 130, a resistor 140, a resistor 150, and an output stage device 160.

The gate drive circuit 100 outputs a gate drive signal from the terminal 101 to a MOSFET (metal-oxide-semiconductor field-effect transistor) serving as a semiconductor switch 50, thereby driving and controlling the MOSFET of the semiconductor switch 50. The terminal 101 is coupled to a gate of the MOSFET of the semiconductor switch 50. The terminal 102 is coupled to a source of the MOSFET of the semiconductor switch 50. The terminal 101 is an example of a gate-drive-signal output terminal. The terminal 102 is coupled to a neutral point 111. The neutral point 111 is an example of a connection point.

The power supplies 110P and 110N are connected in series, with the neutral point 111 placed therebetween. The power supply 110P, which is an example of a positive-voltage power supply, produces a positive voltage relative to the neutral point 111. The power supply 110N, which is an example of a negative-voltage power supply, is coupled to a negative potential side of the neutral point 111. The output voltage of the power supply 110P may be 15 V to 20 V, for example. The output voltage of the power supply 110N relative to the neutral point 111 may be −5 V to −10 V, or may be −15 V to −20 V, for example.

The signal generation unit 120 is a signal source that generates and outputs a pulse signal having a predetermined frequency. The signal generation unit 120 generates a pulse signal having a duty ratio specified by an upper-level apparatus (not shown), for outputting to the photo coupler 130. The pulse signal output from the signal generation unit 120 is an example of a first gate drive signal.

The photo coupler 130 includes a light emitting diode 131 and a phototransistor 132. The light emitting diode 131, which is coupled to the signal generation unit 120, emits light when the pulse signal from the signal generation unit 120 is at the H (high) level, and does not emit light when the pulse signal is at the L (low) level. The photo coupler 130 is an example of a signal isolation unit.

The phototransistor 132 has terminals 132A, 132B, and 132C. The terminal 132A is coupled to the positive terminal of the power supply 110P, and the terminal 132B to the negative terminal of the power supply 110N, with the terminal 132C coupled to the resistors 140 and 150. The terminal 132C is the output terminal of the photo coupler 130.

Upon receiving light from the light emitting diode 131, the phototransistor 132 causes a the terminal 132A and the terminal 132C to be electrically coupled to each other to output a positive voltage supplied from the power supply 110P. During the period in which the light emitting diode 131 emits no light, the light emitting diode 131 causes the terminal 132B and the terminal 132C to be electrically coupled to each other to output a negative voltage supplied from the power supply 110N. As a result, the phototransistor 132 produces a positive voltage when the pulse signal of the signal generation unit 120 is at the H level, and produces a negative voltage when the pulse signal of the signal generation unit 120 is at the L level. The output of the phototransistor 132 is an example of a second gate drive signal, which assumes the H level or the L level in response to the pulse signal of the signal generation unit 120.

The resistor 140 is inserted in the path which connects the terminal 132C to the gate terminals of MOSFETs 160A1 and 160B1. The path which connects the terminal 132C to the gate terminals of MOSFETs 160A1 and 160B1 is an example of a first path.

The resistor 150 is inserted in the path which connects the terminal 132C and the terminal 101. The path which connects the terminal 132C and the terminal 101 is an example of a second path.

The output stage device 160 includes semiconductor switches 160A and 160B. The semiconductor switches 160A and 160B, resistors 161A and 161B, and the power supplies 110P and 110N are connected in series to form a loop.

The semiconductor switches 160A and 160B include the MOSFETs 160A1 and 160B1, respectively, and further include free-wheel diodes 160A2 and 160B2, respectively. The anode and cathode of the free-wheel diode 160A2 are coupled to the source and drain of the MOSFET 160A1, respectively. The anode and cathode of the free-wheel diode 160B2 are coupled to the drain and source of the MOSFET 160A1, respectively. The semiconductor switches 160A and 160B are coupled to each other via a connection point 101A.

The MOSFETs 160A1 and 160B1 are complementary. The MOSFET 160A1 is an N-channel type, and the MOSFET 160B1 is a P-channel type.

The MOSFET 160A1 has a drain terminal thereof coupled to the positive terminal of the power supply 110P via the resistor 161A, and has a source terminal thereof coupled to the source terminal of the MOSFET 160B1, with a gate terminal thereof coupled to the resistor 140 and to the gate terminal of the MOSFET 160B1.

The MOSFET 160B1 has a source terminal thereof coupled to the source terminal of the MOSFET 160A1, and has a drain terminal thereof coupled to the negative terminal of the power supply 110N via the resistor 161B, with a gate terminal thereof coupled to the resistor 140 and to the gate terminal of the MOSFET 160A1.

The MOSFETs 160A1 and 160B1 are driven in a complementary manner by the gate drive signal supplied from the photo coupler 130 via the resistor 140, such that a pulse-shaped gate drive signal comprised of the positive voltage of the power supply 110P and the negative voltage of the power supply 110N is output at the terminal 101. The frequency of the gate drive signal output at the terminal 101 is equal to the frequency of the pulse signal generated by the signal generation unit 120. The gate drive signal output at the terminal 101 is an example of a third gate drive signal.

In the gate drive circuit 100 having the described configuration, the MOSFET 160A1 and the MOSFET 160B1 are placed in the on state and in the off state, respectively, during the period in which the output of the phototransistor 132 of the photo coupler 130 is at the H level. In this case, the terminal 101 receives both the positive voltage supplied from the power supply 110P via the MOSFET 160A1 and the H-level voltage supplied via the resistor 150. The H-level voltage supplied through the resistor 150 is the positive voltage of the power supply 110P supplied through the photo coupler 130.

The MOSFET 160A1 and the MOSFET 160B1 are placed in the off state and in the on state, respectively, during the period in which the output of the phototransistor 132 of the photo coupler 130 is at the L level. In this case, the terminal 101 receives both the negative voltage supplied from the power supply 110N via the MOSFET 160B1 and the L-level voltage supplied via the resistor 150. The L-level voltage supplied through the resistor 150 is the negative voltage of the power supply 110N supplied through the photo coupler 130.

With this arrangement, the output voltage at the terminal 101 is set to the positive voltage supplied from the power supply 110P even when a voltage drop occurs between the gate and source of the MOSFET 160A1 during the period in which the output of the phototransistor 132 of the photo coupler 130 is at the H level. With this arrangement, the output voltage at the terminal 101 is set to the negative voltage supplied from the power supply 110N even when a voltage drop occurs between the gate and source of the MOSFET 160B1 during the period in which the output of the phototransistor 132 of the photo coupler 130 is at the L level.

In this manner, the gate terminal of the MOSFET serving as the semiconductor switch 50 receives the gate drive signal that assumes either the positive voltage of the power supply 110P or the negative voltage of the power supply 110N, which reduces the malfunction of the MOSFET of the semiconductor switch 50. In particular, an erroneous operation by which the MOSFET of the semiconductor switch 50 is turned on by noise when supposed to be turned off is effectively reduced.

According to the embodiment described above, the gate drive circuit 100 that is less likely to cause a malfunction is provided.

Driving the MOSFET of the semiconductor switch 50 with the positive voltage of the power supply 110P and the negative voltage of the power supply 110N also reduces loss at the MOSFET of the semiconductor switch 50. Due to the fact that the semiconductor switch 50 may be used in an inverter for the UPS (uninterruptible power systems), for example, the reduction of loss carries a significant meaning.

Figure 2:
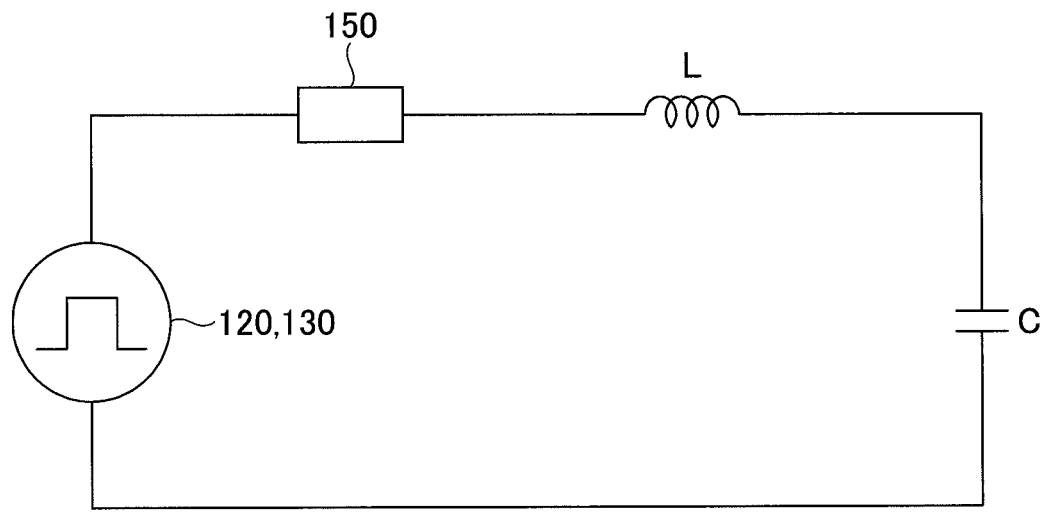
FIG. 2 is a circuit diagram schematically illustrating a path from a photo coupler to a semiconductor switch via a resistor.

In the following, the resistance of the resistor 150 will be described by referring to FIG. 2 and FIG. 3. FIG. 2 is a circuit diagram schematically illustrating the path from the photo coupler 130 to the semiconductor switch 50 via the resistor 150. In FIG. 2, the signal generation unit 120 and the photo coupler 130 are collectively illustrated as one unit.

In FIG. 2, an inductance L is a composite inductance that includes both the inductance of a path from the photo coupler 130 to the terminal 101 via the resistor 150 and the inductance of a path from the terminal 101 to the gate terminal of the MOSFET serving as the semiconductor switch 50. A capacitance C is the capacitance between the gate and source of the MOSFET serving as the semiconductor switch 50 as viewed from the terminal 101, i.e., the input capacitance of the semiconductor switch 50.

With respect to the gate drive circuit 100, the MOSFET of the semiconductor switch 50 may be considered to be a circuit that is directly driven by the output of the photo coupler 130. Because of this, there is a need to ensure that no oscillation occur on the path from the photo coupler 130 to the gate terminal of the MOSFET of the semiconductor switch 50 via the resistor 150 and the terminal 101.

When the resistance of the resistor 150 is denoted as R, the circuit inclusive of the above-noted path constitutes an RLC series circuit as illustrated in FIG. 2. As the output of the photo coupler 130 is a rectangular wave, the behavior of this circuit may be considered to be a step response of a second-order delay system.

Figure 3:
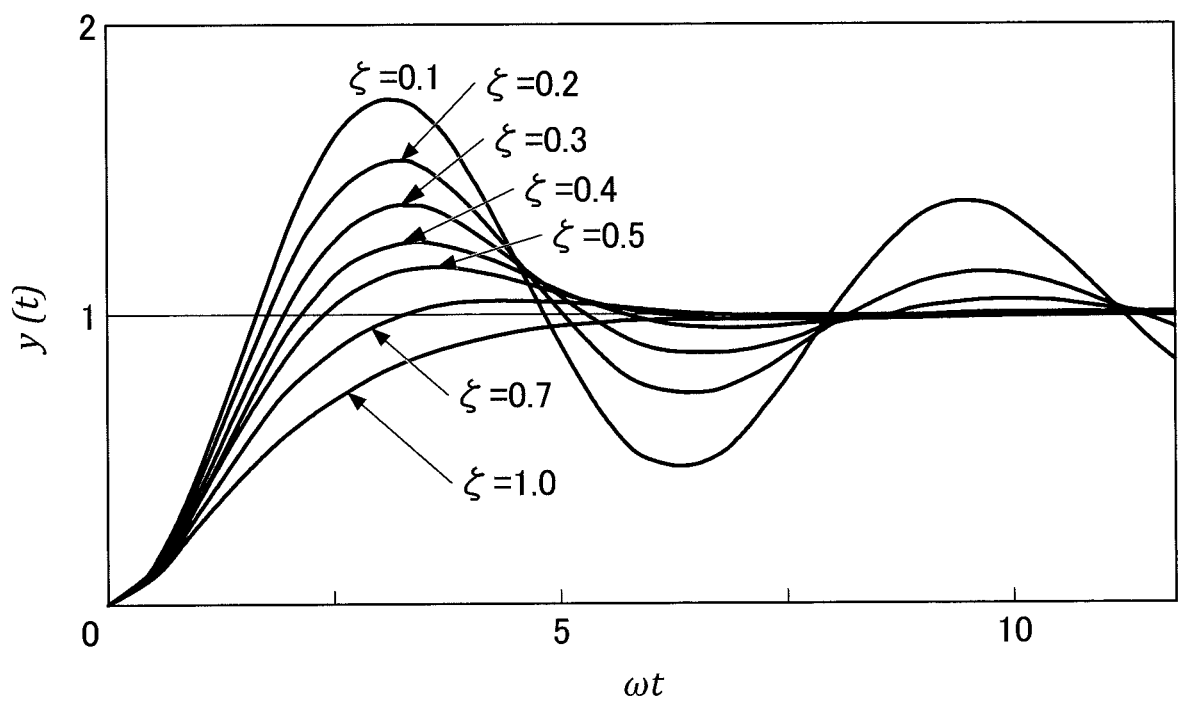
FIG. 3 is a drawing illustrating the step response of a second-order delay system.

FIG. 3 is a drawing illustrating the step response of a second-order delay system. As illustrated in FIG. 3, the damping coefficient is preferably greater than or equal to 0.7. The damping coefficient of an RLC circuit is represented as $C=R/2\cdot(C/L)^{1/2}$. Based on the requirement expressed as $0.7 \geq R/2\cdot(C/L)^{1/2}$, it suffices for the resistance R of the resistor 150 to be set to satisfy: $R \geq 1.4\cdot(L/C)^{1/2}$. R may be a composite value obtained by adding up the resistance of the resistor 150 and the resistance of the second path.

Figure 4A:
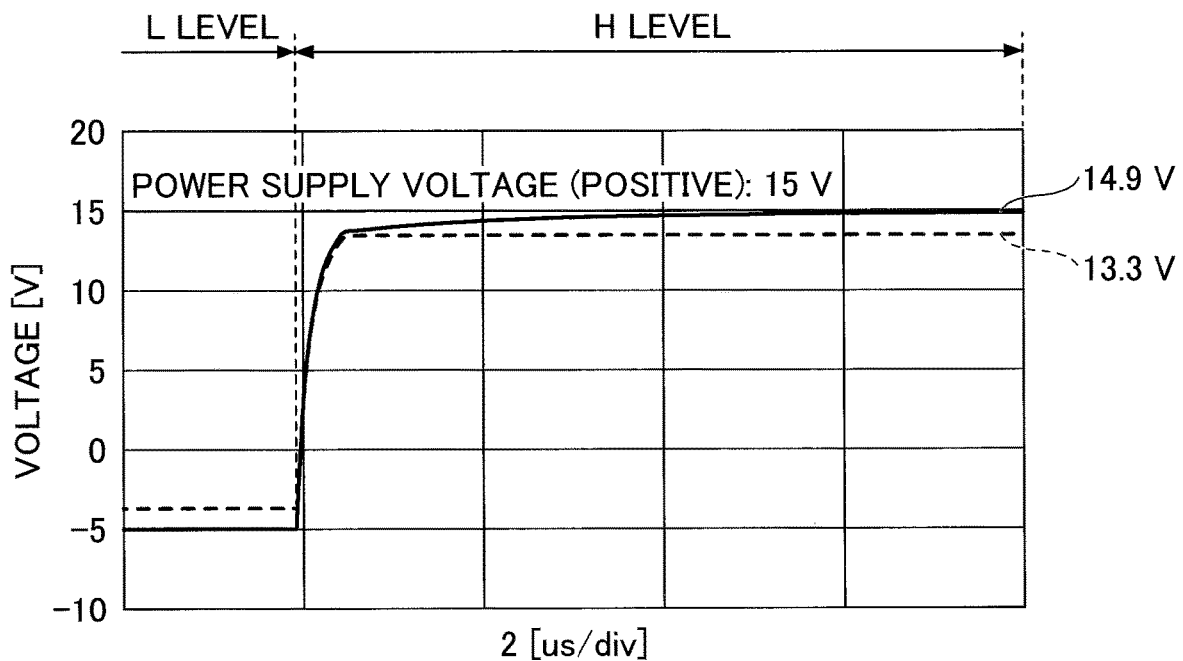
FIGS. 4A and 4B are drawings illustrating the results of an experiment regarding an output voltage at a terminal.
Figure 4B:
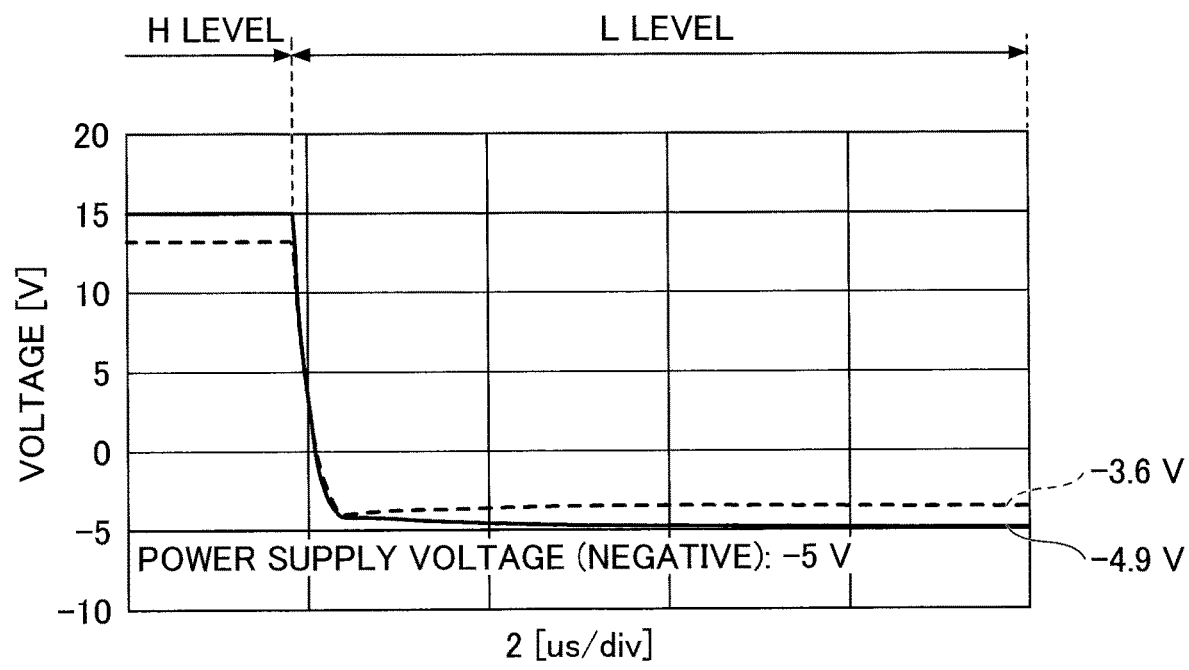

FIGS. 4A and 4B are drawings illustrating the results of an experiment regarding an output voltage at the terminal 101. FIGS. 4A and 4B illustrates the period in which the pulse signal output from the signal generation unit 120 is at the H level and the period in which the pulse signal is at the L level. In FIGS. 4A and 4B, the output voltage at the terminal 101 of the gate drive circuit 100 according to the present embodiment is shown in solid lines, and the output voltage at the terminal 101 of a comparative-example gate drive circuit is shown in dashed lines. The comparative-example gate drive circuit has the same configuration as the gate drive circuit 100, except that the resistor 150 and the path from the photo coupler 130 to the terminal 101 via the resistor 150 are removed.

In the experiment, the voltage of the power supply 110P was set to 15 V, and the voltage of the power supply 110N was set to –5 V. The resistance of the resistor 140 was 10Ω, and the resistance of the resistor 150 was 33Ω. The inductance L of the path from the photo coupler 130 to the terminal 101 via the resistor 150 was 20 nH. The capacitance C between the gate and source of the MOSFET of the semiconductor switch 50 as viewed from the terminal 101 was 16 nF. The resistances of the resistors 161A and 161B were 5.7Ω.

As illustrated in FIG. 4A, during the period in which the pulse signal output from the signal generation unit 120 was at the H level, the output voltage at the terminal 101 of the gate drive circuit 100 was 14.9 V, and the output voltage at the terminal 101 of the comparative-example gate drive circuit was 13.3 V.

As illustrated in FIG. 4B, during the period in which the pulse signal output from the signal generation unit 120 was at the L level, the output voltage at the terminal 101 of the gate drive circuit 100 was –4.9 V, and the output voltage at the terminal 101 of the comparative-example gate drive circuit was –3.6 V.

In this manner, satisfactory results were obtained such that the output voltage at the terminal 101 of the gate drive circuit 100 differed by only 0.1 V from the output voltage of the power supply 110P or 110N during both of the periods in which the pulse signal output from the signal generation unit 120 was at the H level and at the L level. This is a significant improvement over the comparative-example gate drive circuit.

The above description has been directed to the configuration in which the resistor 150 is inserted in the path between the photo coupler 130 to the terminal 101. Alternatively, the resistor device 150 may not be provided in the gate drive circuit 100 when the resistance value of the path from the photo coupler 130 to the terminal 101 is sufficiently large.

The above description has been directed to the configuration in which the photo coupler 130 is used as a signal isolation unit for isolating the output stage device 160 from the signal generation unit 120. This photo coupler 130 is not a limiting example. Another device different from the photo coupler 130 may be used as long as such a device is capable of providing isolation between the signal generation unit 120 and the output stage device 160.

Further, the above description has been directed to the configuration in which the semiconductor switches 160A and 160B include the MOSFETs 160A1 and 160B1, respectively. Alternatively, other switching elements different from MOSFETs, such as IGBTs (insulated gate bipolar transistors) or bipolar transistors, may be used in place of the MOSFETs 160A1 and 160B1. The material of the semiconductor switches 160A and 160B is not limited to silicon, and may alternatively be a silicon carbide (SiC), a gallium nitride (GaN), or the like.

The descriptions of the gate drive circuit of exemplary embodiments have been provided heretofore. The present invention is not limited to these embodiments, but various variations and modifications may be made without departing from the scope of the present invention.

The present application is based on and claims priority to Japanese patent application No. 2018-039049 filed on Mar. 5, 2018, with the Japanese Patent Office, the entire contents of which are hereby incorporated by reference.

What is claimed is:
1. A gate drive circuit, comprising:
a signal generation unit configured to generate a first gate drive signal;
a signal isolation unit configured to produce, at an output side thereof in response to the first gate drive signal, a second gate drive signal electrically isolated from the signal generation unit;
an output stage device configured to receive the second gate drive signal at an input side thereof and to produce a third gate drive signal at an output side thereof in response to the second gate drive signal, the output stage device including a first semiconductor switch and a second semiconductor switch which are complementary to each other and driven by the second gate drive signal, the third gate drive signal being produced at a connection point between the first semiconductor switch and the second semiconductor switch;
a first path connecting the output side of the signal isolation unit and the input side of the output stage device; and
a second path connecting the output side of the signal isolation unit and the output side of the output stage device,
wherein the output side of the signal isolation unit bifurcates at a branch point into the first path and the second path, the branch point being electrically connected to the input side of the output stage device through the first path, the branch point being electrically connected to the output side of the output stage device through the second path, wherein the second path extends from the branch point to the output side of the output stage device, without any line branching off from an intermediate point thereof.

2. The gate drive circuit as claimed in claim 1, further comprising a resistor inserted in the second path.

3. The gate drive circuit as claimed in claim 1, wherein a resistance of the second path is denoted as R, and an inductance of a path from the output side of the signal isolation unit via the second path to a gate terminal of a controlled semiconductor switch to be coupled to the output side of the output stage device is denoted as L, an input capacitance of the controlled semiconductor switch being denoted as C, and wherein the resistance R is configured to satisfy: $R \geq 1.4 (L/C)^{1/2}$.

4. The gate drive circuit as claimed in claim 2, wherein an inductance of a path from the output side of the signal isolation unit via the second path to a gate terminal of a controlled semiconductor switch to be coupled to the output side of the output stage device is denoted as L, and a resistance of the resistor is denoted as R, an input capacitance of the controlled semiconductor switch being denoted as C, and wherein the resistance R is configured to satisfy: $R \geq 1.4 (L/C)^{1/2}$.

5. The gate drive circuit as claimed in claim 2, wherein an inductance of a path from the output side of the signal isolation unit via the second path to a gate terminal of a controlled semiconductor switch to be coupled to the output side of the output stage device is denoted as L, and a resistance of the resistor and the second path is denoted as R, an input capacitance of the controlled semiconductor switch being denoted as C, and wherein the resistance R is configured to satisfy: $R \geq 1.4 (L/C)^{1/2}$.

6. A gate drive circuit, comprising:

an output unit configured to output, at an output node thereof, a drive signal that assumes either a high level or a low level;

an output stage device including a first semiconductor switch and a second semiconductor switch which are driven by the drive signal, the output stage device configured to output a gate driving signal at a connection point between the first semiconductor switch and the second semiconductor switch based on the drive signal;

a first path connecting, through a resistor, the output node and an input side of the output stage device, the drive signal being input into the input side of the output stage device; and a second path connecting the output node and the connection point, wherein the output unit outputs at the output node the drive signal assuming a high level based on a voltage supplied from a first power supply, and outputs at the output node the drive signal assuming a low level based on a voltage supplied from a second power supply different from the first power supply, wherein during a high-level period of the drive signal, a voltage supplied from the first power supply through the first semiconductor switch and a voltage supplied from the first power supply through the second path are supplied to the connection point, and wherein during a low-level period of the drive signal, a voltage supplied from the second power supply through the second semiconductor switch and a voltage supplied from the second power supply through the second path are supplied to the connection point.

* * * * *